(12) United States Patent
Lafleur

(10) Patent No.: US 6,913,470 B1
(45) Date of Patent: Jul. 5, 2005

(54) ADAPTABLE COMPUTER CARD I/O CONNECTION

(75) Inventor: Robert Lafleur, Baie d'Urfé (CA)

(73) Assignee: Matrox Electronics Systems Ltd., Dorval (CA)

( * ) Notice: Subject to any disclaimer, the term of this patent is extended or adjusted under 35 U.S.C. 154(b) by 0 days.

(21) Appl. No.: 09/990,876

(22) Filed: Nov. 23, 2001

Related U.S. Application Data

(60) Provisional application No. 60/252,479, filed on Nov. 22, 2000.

(51) Int. Cl.[7] .............................................. H01R 9/09
(52) U.S. Cl. ...................................... 439/71; 361/684
(58) Field of Search ............................ 439/61, 78, 79, 439/82, 84, 88, 567, 569; 361/684, 686, 737, 785, 789, 791, 788

(56) References Cited

U.S. PATENT DOCUMENTS

| | | | | |
|---|---|---|---|---|
| 5,044,984 A | * | 9/1991 | Mosser et al. ............ | 439/541.5 |
| 5,080,609 A | * | 1/1992 | Fabian et al. ............. | 439/541.5 |
| 5,085,590 A | * | 2/1992 | Galloway ...................... | 439/95 |
| 5,167,531 A | * | 12/1992 | Broschard et al. ........ | 439/541.5 |
| 5,336,109 A | * | 8/1994 | Hillbish et al. .......... | 439/541.5 |
| 5,587,884 A | * | 12/1996 | Raman ......................... | 361/728 |
| 5,757,582 A | * | 5/1998 | White et al. ............. | 360/98.01 |
| 5,772,453 A | * | 6/1998 | Tan et al. ...................... | 439/79 |
| 5,788,511 A | * | 8/1998 | Burnworth et al. ........... | 439/63 |
| 6,375,495 B1 | * | 4/2002 | Szeto ....................... | 439/540.1 |
| 6,466,434 B1 | * | 10/2002 | Tsai ............................ | 361/685 |
| 6,518,961 B2 | * | 2/2003 | Sung .......................... | 345/204 |

* cited by examiner

Primary Examiner—Thanh-Tam Le
(74) Attorney, Agent, or Firm—Ogilvy Renault LLP

(57) ABSTRACT

The computer motherboard-mounted card such as a dual-head graphics card has two I/O connectors and two footprints positioned one behind the other for accommodating two different output types. A right-angle, vertical edge, I/O connector mounted in a selected one of the two footprints. The I/O connector can be selectively connected to a farther one of the two footprints from a vertical edge of the computer card and be provided with a correspondingly horizontally elongated body.

18 Claims, 12 Drawing Sheets

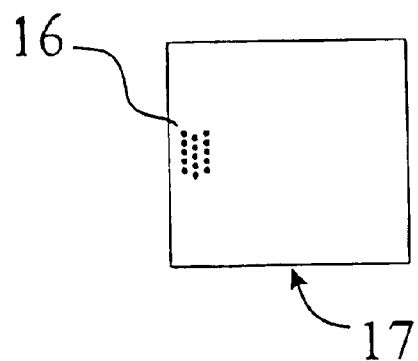
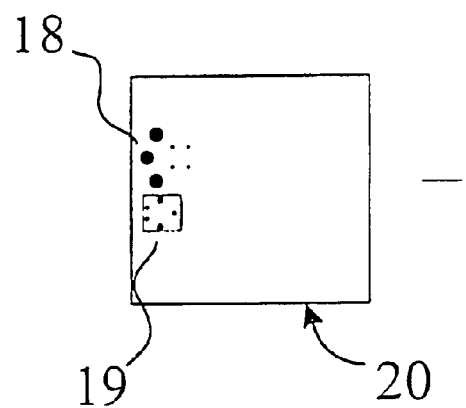
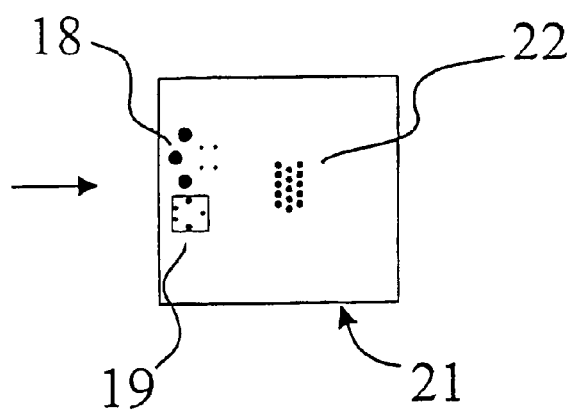

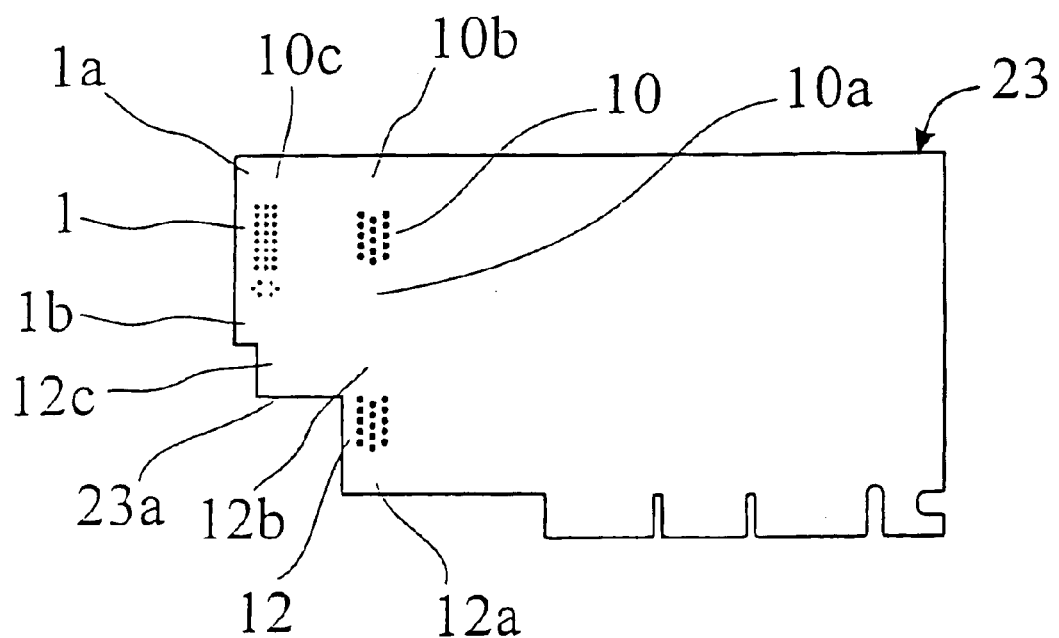

FIG. 13
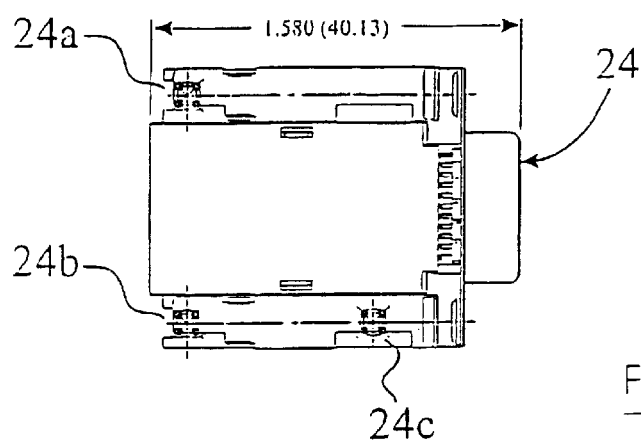
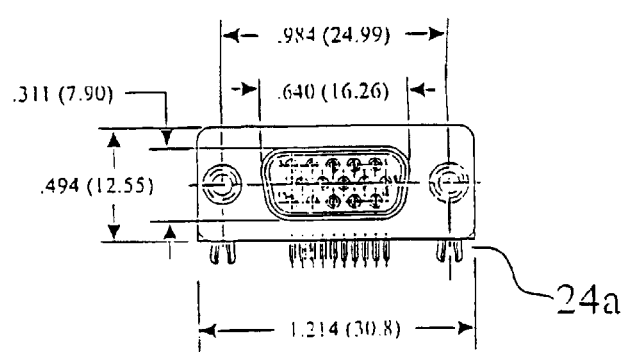
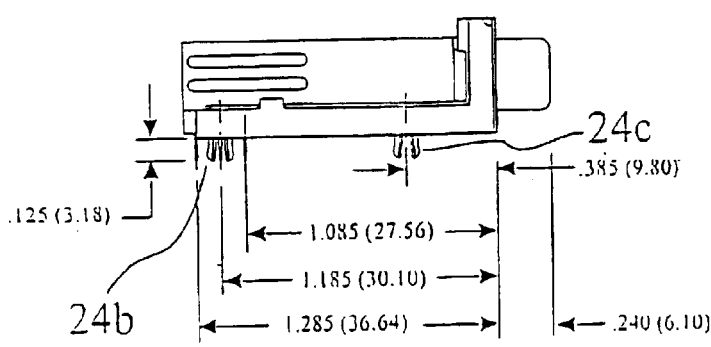

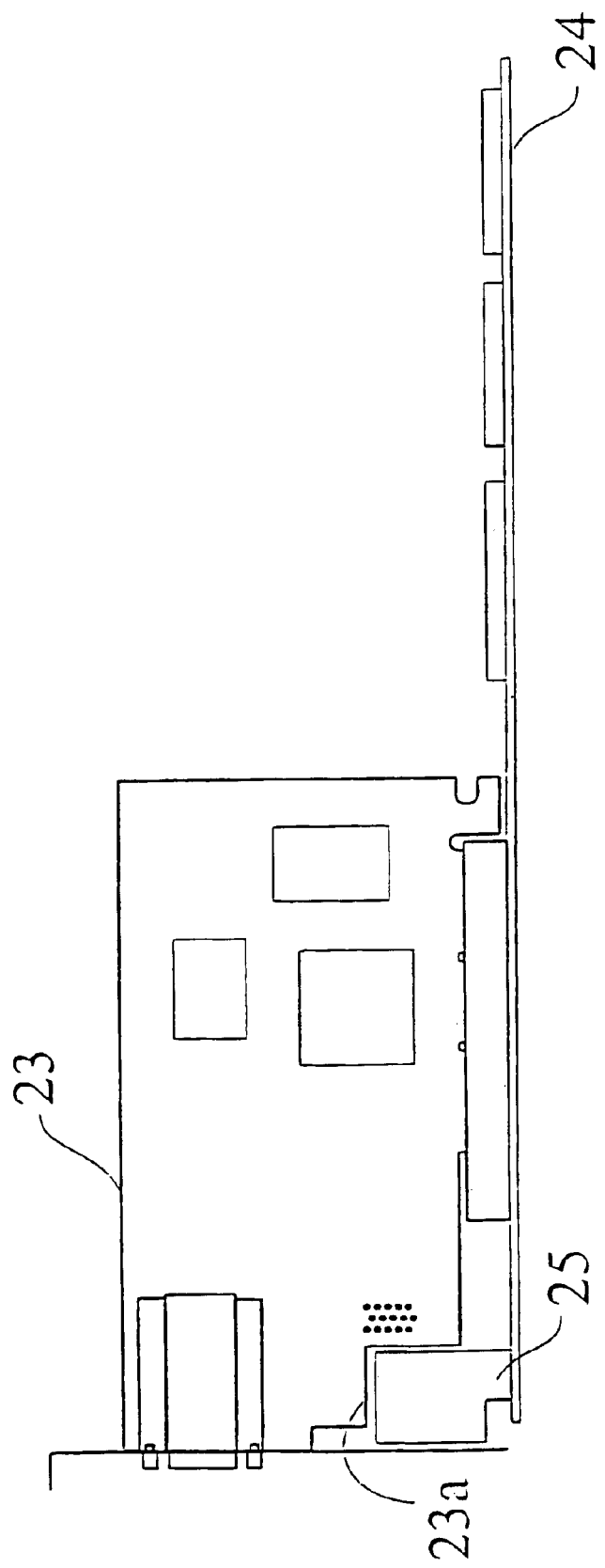

ADAPTABLE COMPUTER CARD I/O CONNECTION

This application claims the benefit of U.S. Provisional Appl. 60/252,479, filed Nov. 22, 2000.

FIELD OF THE INVENTION

The present invention relates to a method for providing connector options for different connector types, and in particular for different form factor I/O card solutions, such as NLX and ATX. The invention also relates to a computer motherboard mounted card which is to be provided with a variable type of I/O connector, such as in the case of a graphics card.

BACKGROUND OF THE INVENTION

Motherboard mounted computer graphics cards are known which provide dual display output. When made for two displays, also known as a dual-head mode, the graphics card can operate with the first display or head either as a digital flat panel output (DVI) or a standard analog monitor output (HD-15). The second head can be a standard analog monitor output RGB (HD-15) or television (Mini-din or RCA).

Since it is not mechanically possible to fit all five connectors in the I/O bracket opening (DVI, HD-15, HD15, Mini-Din, RCA), choosing which connections will make up the dual-head configuration must be made. Thus, if it is not possible to put all five connectors on one I/O card, multiple variations of cards must be designed.

In an ATX form factor, one would have to design four different I/O cards to support all modes of operation of dual head product capabilities. These fours variations are;
1) Digital flat panel (DVI) and analog monitor (HD-15).
2) Digital flat panel (DVI) and video (Mini-din and RCA).
3) Analog monitor (HD-15) and analog monitor (HD-15).
4) Analog monitor (HD-15) and video (Min-din and RCA).

One attempt to reduce the number of I/O card configurations by half, is to use a breakout cable as an adapter. This adapter converts an HD-15 connector into two video connectors, the mini-DIN4 and RCA. Thus, for the second head, all I/O cards would have an HD-15 connector, and with the help of this break-out cable, either an analog monitor or TV/VCR can be connected. However, even with this breakout cable, two cards still need to be designed; card 1 and card 3 described above.

To reduce further the number of boards to design from 2 to 1, one can provide only one board with a DVI connector and provide a DVI to HD-15 adapter. However, the combined cost of the adapter and the DVI board connector is expensive.

In addition to the connector combination needs for the ATX form factor dual-head graphics card, a similar set of combinations for the NLX form factor is required. The NLX was designed to improve upon today's low form factors and to adapt to new market trends and PC technologies. The NLX form factor is an attempt at incorporating flexibility to accommodate the best designs for current and future PC's.

Since the NLX motherboard specification accommodates the use of double width connectors across half of the rear I/O and single high across the whole maximum board width, the I/O card must be designed with this form factor in mind. Therefore, the combinations of (DVI and HD-15), (HD-15 and HD-15), (HD-15 and Mini-din and RCA), and (DVI and Mini-din and RCA) cannot be connected by mounting directly above each other on the I/O card as is possible with the ATX form factor. Instead, a special module must be designed that attaches to the baseboard and has the second connector mounted in a double width connector bracket. This is the standard solution for NLX form factor cards having dual I/O connectors. In an NLX form factor, one would have to design four different I/O cards to support all modes of operation of dual head product capabilities. These four variations are:
1) Digital flat panel (DVI).
2) Analog monitor (HD-15).
3) Analog monitor (HD-15) module.
4) Video (Mini-din and RCA) module.

In order to achieve the same dual head product capabilities as with the ATX form factor the four variations outlined above must be combined in the following way:
1) Digital flat panel (DVI) with analog monitor (HD-15) module.
2) Digital flat panel (DVI) with video (Mini-din and RCA) module.
3) Analog monitor (HD-15) with analog monitor (HD-15) module.
4) Analog monitor (HD-15) with video (Mini-din and RCA) module.

Although the NLX form factor changes have resulted in a reduction in overall system level cost for the computer, there has been an increase in cost for the I/O card manufacturers as they have to design specific I/O cards to fit the NLX form factor. If the same options in the NLX form factor as in the ATX form factor were to be provided, eight I/O cards would have to be designed.

SUMMARY OF THE INVENTION

Therefore, it is an object of the invention to provide a way of connecting combinations and permutations of dual-head connector options for NLX and ATX form factor I/O.

The object of the present invention relates to deriving a way of reducing the number of I/O cards required from eight cards to two cards; one card is a base and the other card is a module. For example, instead of having to design one ATX form factor card with a (DVI and HD-15) connector, plus one ATX form factor card with a (HD-15 and HD-15) connector, plus one ATX form factor with a (DVI and SVHS with mini-din and RCA) connector, plus one ATX form factor card with a (HD-15 and SVHS with mini-din and RCA) connector, plus one NLX form factor card with a (DVI) connector, plus one NLX form factor card with a (HD-15) connector, plus one (HD-15) module, plus one (SVHS with mini-din and RCA) module, the way in which the card is designed requires that only one NLX form factor card and one module is manufactured. This approach brings about an advancement in inventory management and lowers PCB cost.

This novel approach to managing the possible combinations of dual-head connector solutions is achieved by designing a "long body", high density, right angle, PCB D-Subminiature (HD-15) connector that clears the NLX I/O card cutout located at the lower front section of the card. In this case, a change to the footprint architecture must be made to accommodate the new "long body" HD-15 connector. This new footprint architecture along with the custom designed HD-15 connector serves as the catalyst of this design idea. Another object of this invention is changing the footprint architecture on the upper front section of the NLX I/O card, enabling it to clear the DVI footprint architecture. The DVI footprint architecture is located close to the edge of the card and is positioned in front of the newly positioned HD-15 footprint architecture. The result is one NLX form factor card that has one DVI and two HD-15 footprints.

Therefore, by combining this new NLX form factor card that uses the new "long-body" HD-15 footprint architecture with a new "long body" I/O module footprint architecture, a wide range of dual-head display possibilities can be achieved. Simultaneous output either to (two RGB monitors), to (an RGB monitor and a television set), to (an RGB monitor and a digital flat panel) or to (a digital flat panel and TV set) can be achieved with only one I/O card and one I/O module.

Another object of the present invention involves an incremental approach to reducing the number of I/O cards within similar, dissimilar, and a combination thereof of I/O card form factors which ultimately lead to the primary objective of the present invention in optimizing the reduction of I/O cards required to be manufactured.

The four ATX form factor card configurations consist of one card with (DVI and HD-15 footprints), one card with (two HD-15 footprints), one card with (one DVI and one SVHS with mini-din, and one RCA footprints), and one card with (one HD-15 and one SVHS with mini-din, and one RCA footprint). The possible combinations derived from the four ATX form factor card connections outline above can be reduced to one card with (one DVI, two long body HD-15, one Mini-din, and one RCA footprint).

The two NLX form factor card configurations consist of one card with (one DVI footprint) and one card with (one HD-15 footprint). The possible combinations derived from these two NLX form factor card configurations can be reduced to one card with (one DVI footprint) and (one long body HD-15 footprint).

The two module configurations that consist of one HD-15 module and one Mini-din and RCA module can be reduced to one module that includes the two configurations.

Reducing the number of cards required to its optimal level is achieved by combining the result of the one ATX form factor card solution as outlined above, the result of the one card NLX form factor solution as outlined above, and the result of one module solution outlined above. The end result is the need to manufacture only one NLX form factor I/O card that has one DVI footprint and two long body HD-15 footprints and one module that has one Mini-din, one RCA, and one long body HD-15 footprint.

According to the invention, there is provided a computer motherboard-mounted card having at least one I/O connector, the card comprising: two footprints positioned one behind the other for accommodating two different output types; and one right-angle, vertical edge, I/O connector mounted with pins in a selected one of the two footprints.

Another benefit of the invention is that it allows users to reconfigure their systems to use different monitors in different situations or as needs change. The breakout cables, adapters, and/or modules provide much flexibility to the user.

The invention also provides a method of manufacturing a motherboard-mounted computer card having at least one I/O connector, the method comprising: providing at least two footprints positioned on the computer card for accommodating two different output types; providing a plurality of different right-angle, vertical edge, I/O connectors having mounting pins receivable by a selected one of the at least two footprints, the I/O connectors being adapted to reach the selected one of the footprints while providing a vertical edge I/O connector substantially at a common position; and selectively mounting one of the plurality of I/O connectors to one of the footprints.

BRIEF DESCRIPTION OF THE DRAWINGS

A better understanding of the invention will be obtained by reference to the detailed description below in conjunction with the following drawings, in which:

FIG. 9 is a plan view of a module showing a HD-15 footprint according to prior art.

FIG. 10 is a plan view of a module showing a Mini-din, and RCA footprint according to prior art.

FIG. 11 is a plan view of a module showing a Mini-din, RCA, and long body HD-15 footprint.

FIG. 12 is a plan view of an NLX form factor card showing one DVI footprint and two long body HD-15 footprints.

FIG. 13 is a plan view of a "long-body" HD-15 connector showing top, front, and side views.

FIG. 14 is a 2-Dimensional side view of an NLX form factor I/O card plugged into an AGP slot of an NLX form factor motherboard.

DETAILED DESCRIPTION OF THE PREFERRED EMBODIMENTS

References will now be in detail to the preferred embodiments of the invention. While the present invention has been described in with reference to the specific embodiments, the description is illustrative of the invention and is not to be construed as limiting the invention. Various modifications to the present invention can be made to the preferred embodiments by those skilled in the art without departing from the essential methodology and scope of the invention as defined herein.

For example, a long body DVI connector, or a long body TV out (composite plus Y/C video) connector could be used to provide alternative dual head ATX/NLX PCB designs with similar advantages to the preferred embodiment.

Figure 1:
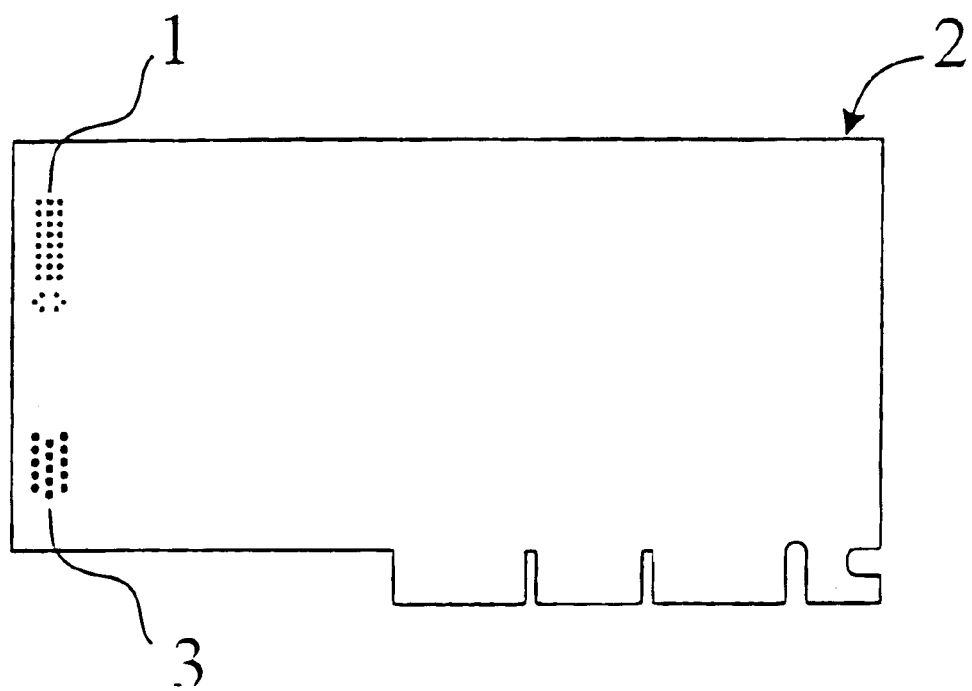
FIG. 1 is a plan view of an ATX form factor I/O card showing a DVI and HD-15 footprint according to the prior art.

FIG. 1 illustrates a dual-head footprint solution on an ATX form factor card 2. The footprint I at the upper front section of card 2 is for a DVI connection. The footprint 3 at the lower front section of card 2 is for a HD-15 connection. The DVI connector (not shown) has pins soldered to the contacts in footprint 1, and for mechanically mounting the connector to the board 2, three through holes 12a, 12b and 12c are provided for receiving mounting members of the connector. The HD-15 connector (not shown) likewise has mounting members for fitting into through holes 12d and 12e, while the pins of the HD-15 connector are soldered into footprint 3.

Figure 2:
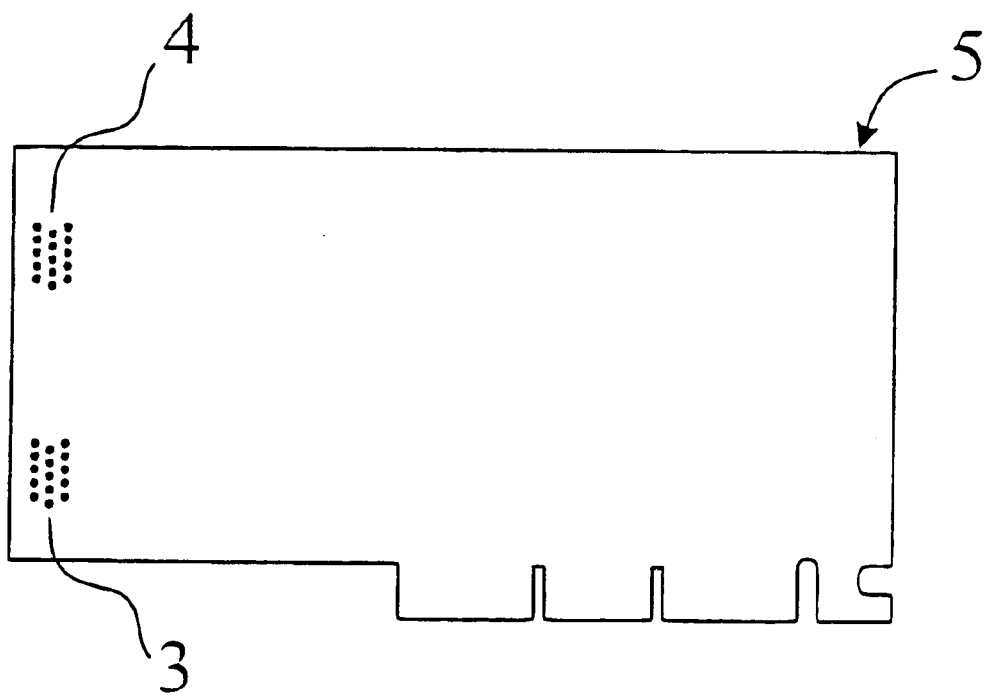
FIG. 2 is a plan view of an ATX form factor I/O card showing two HD-15 footprints according to the prior art.

FIG. 2 illustrates a dual-head footprint solution on an ATX form factor card 5. The footprint 4 at the upper front section of card 5 is for a HD-15 connection. The footprint 3 at the lower front section of card 5 is also for a HD-15 connection.

Figure 3:
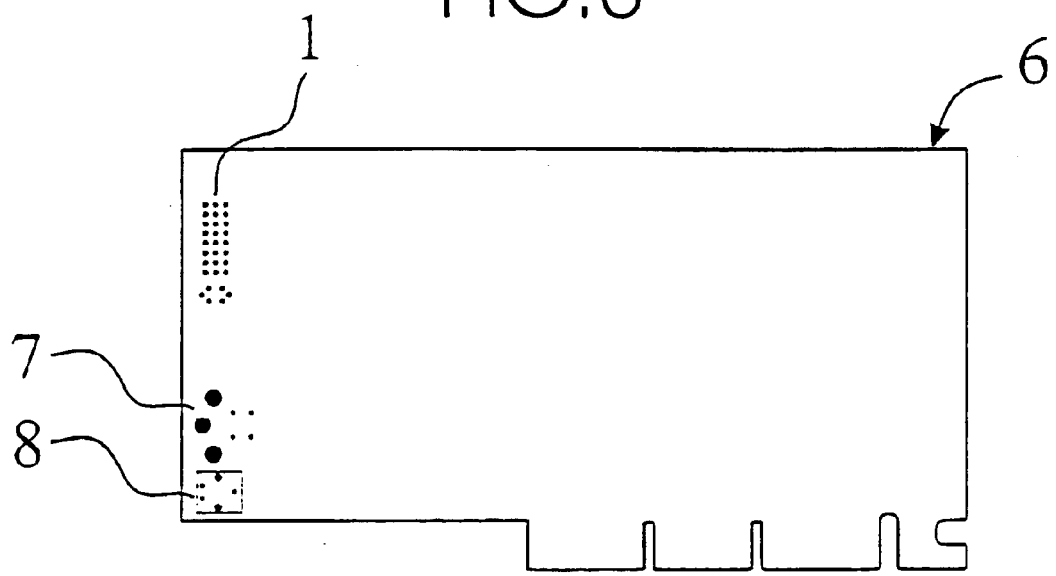
FIG. 3 is a plan view of an ATX form factor I/O card showing a DVI, Mini-din, and RCA footprint according to the prior art.

FIG. 3 illustrates three possible combinations of footprints on an ATX form factor card 6. The footprint 1 at the upper front section of card 6 is for a DVI connection. The two footprints at the lower front section are for a Mini-din 7 and RCA 8 footprint.

Figure 4:
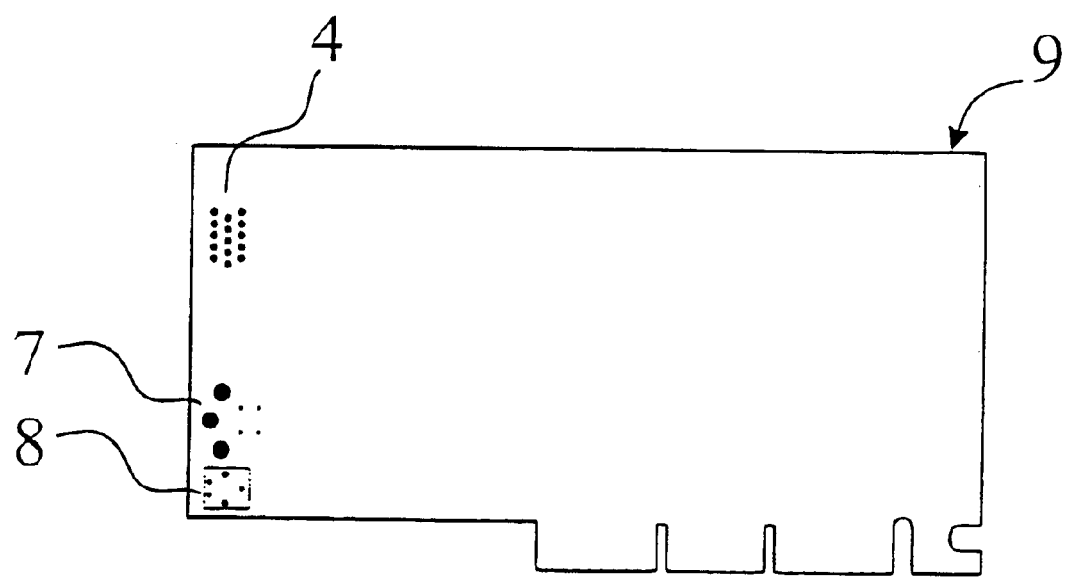
FIG. 4 is a plan view of an ATX form factor I/O card showing a HD-15, Mini-din, and RCA footprint according to the prior art.

FIG. 4 illustrates three possible combinations of footprints on an ATX form factor card 9. The footprint 4 at the upper front section of card 9 is for an HD-15 connection. The two footprints at the lower front section are for a Mini-din 7 and RCA 8 footprint.

Figure 5:
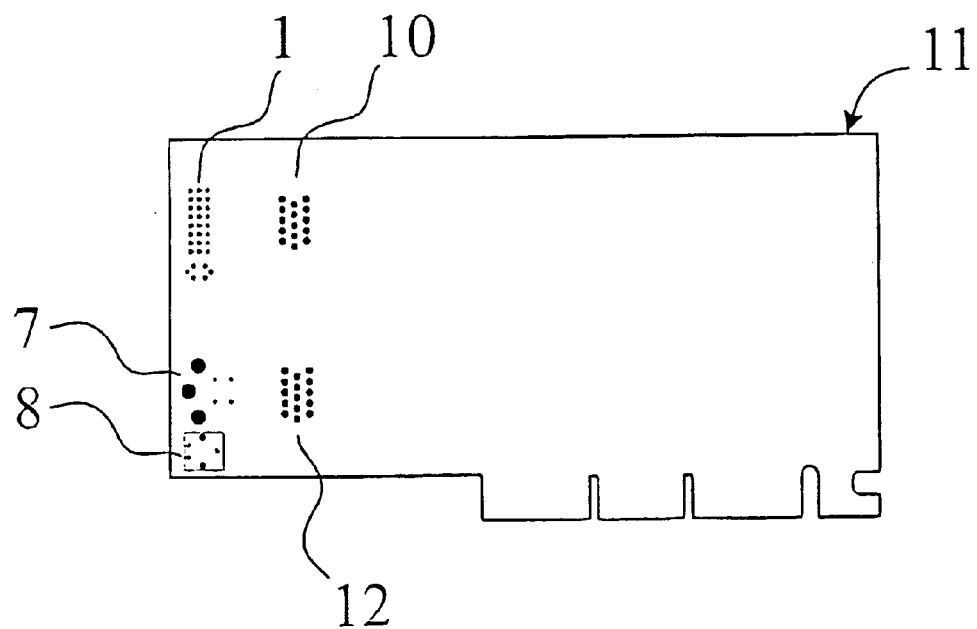
FIG. 5 is a plan view of an ATX form factor I/O card showing a DVI, SVHS with Mini-din, RCA, and two long body HD-15 footprints.

FIG. 5 illustrates five possible combinations of footprints on an ATX form factor I/O card 11. The footprint 1 at the upper front section of card 11 is for a DVI connection. The footprint 7 at the lower front section of card 11 is for a Mini-din connection. The footprint located directly below footprint 7 is for an RCA connection 8. In the upper front section located horizontally adjacent to footprint 1 is a long body HD-15 footprint 10. Vertically below footprint 10 is the second long body HD-15 footprint 12.

Figure 6:
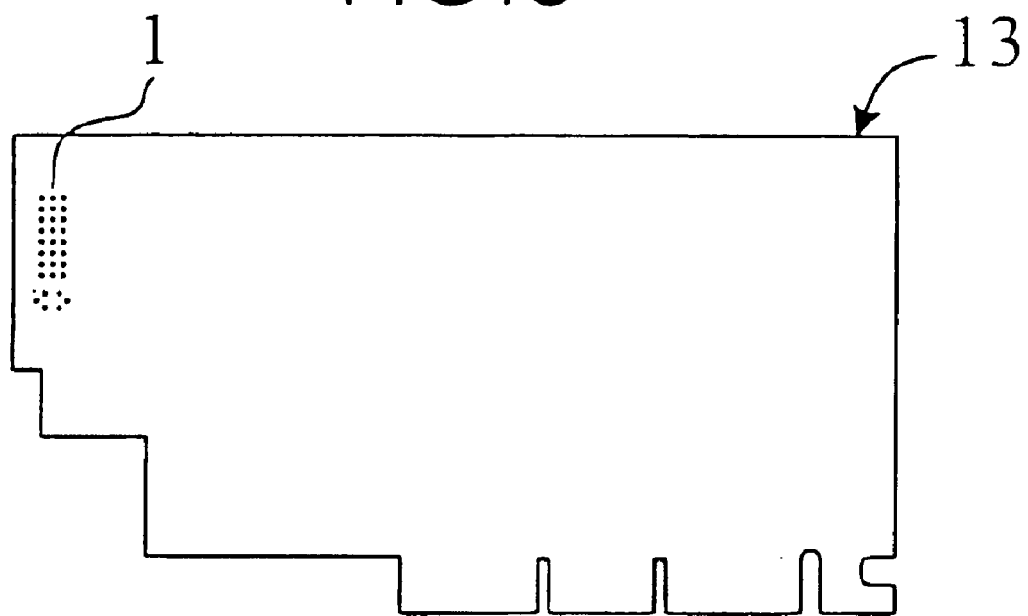
FIG. 6 is a plan view of an NLX form factor I/O card showing a DVI footprint according to prior art.

FIG. 6 illustrates a single-head footprint on an NLX form factor card 13. The footprint 1 at the upper front section of card 13 is for a DVI connection 1.

Figure 7:
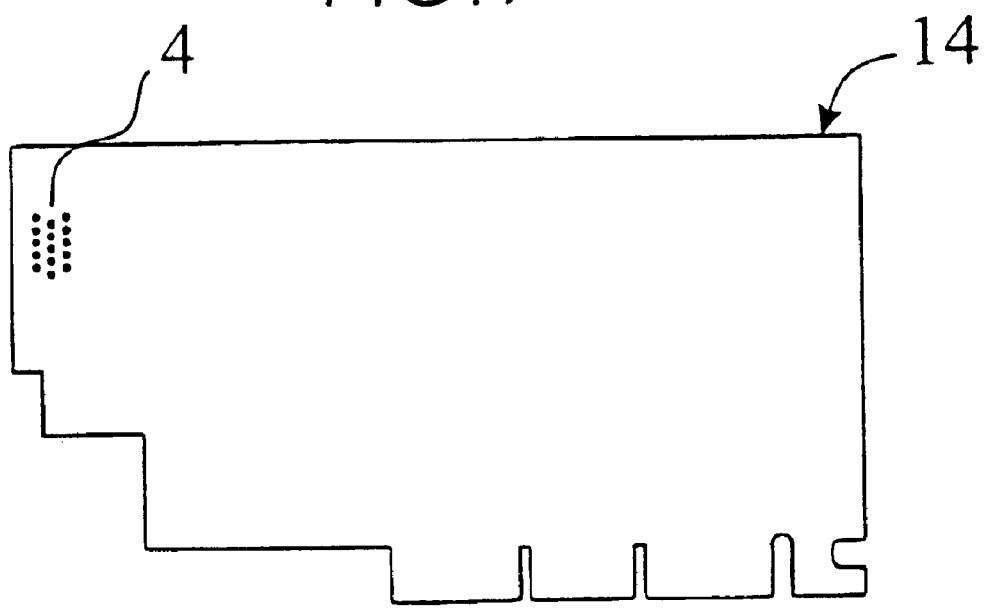
FIG. 7 is a plan view of an NLX form factor I/O card showing a HD-15 footprint according to prior art.

FIG. 7 illustrates a single-head footprint on an NLX form factor card 14. The footprint 4 at the upper front section of card 14 is for a HD-15 connection.

Figure 8:
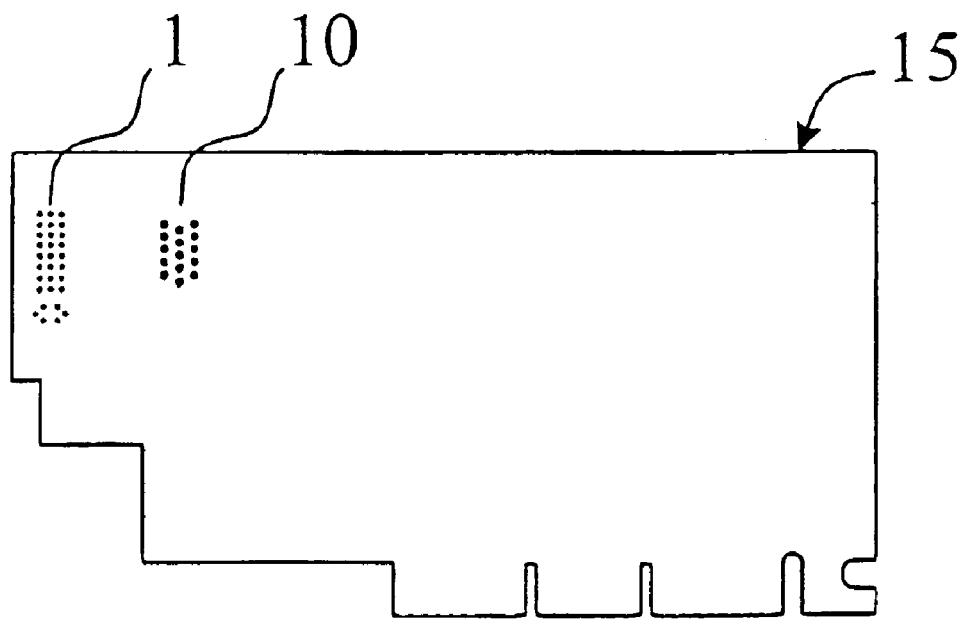
FIG. 8 is a plan view of an NLX form factor card showing a DVI and long body HD-15 footprint.

FIG. 8 illustrates two possible combinations of footprints on an NLX form factor I/O card 15. The footprint at the upper front section is for a DVI connection 1 and the footprint horizontally opposite footprint 1 in the upper section is for a long body HD-15 connection 10.

FIG. 9 illustrates a single head module 17. The footprint 16 at the front section is for a HD-15 connection.

FIG. 10 illustrates two possible combinations of footprints on a module 20. The footprint 18 at the upper front section is for a Mini-din connection and the footprint at the lower front section is for an RCA.

FIG. 11 illustrates three possible combinations of footprints on a module 21. The footprint 18 at the upper front section is for a Mini-din connection and the footprint at the lower front section is for an RCA connection 19. The footprint horizontally opposite footprints 18, 19 is for a long body HD-15 connection 22.

FIG. 12 illustrates three possible combinations of footprints on an NLX form factor card 23. The footprint 1 at the upper front section of card 23 is for a DVI connection. The second footprint 10 located next to footprint 1 at the upper front section is for a long body HD-15 connection 10. The footprint 12 is located at the lower front section of the card and is perpendicular to footprint 10 above it.

FIG. 13 illustrates a plan view of a "long-body" HD-15 connector 24. With a length of 1.580" (40.13 mm) the HD-15 connector 24 fits the HD-15 footprint 10 and HD-15 footprint 12. The special size of connector 24 and corresponding footprints 10 and 12 allow for connecting combinations and permutations of dual-head connector options for NLX and ATX form factor solutions. The connector 24 has mounting members 24a and 24b, and 24c which fit through holes 10a, 10b and 10c (FIG. 12) for upper front section fitting and 12a, 12b and 12c (FIG. 12) respectively for lower front section settings and have bendable legs for fastening connector 24 to the board 23. The third member 24c provides stability for the mounting of connector 24 and mounts on card 23 above the cut-out 23a when mounted in the lower front section of the I/O card. In this way, the card 23 can be used for ATX form factor computers with dual connectors mounted on the I/O card one above the other.

FIG. 14 illustrates a 2-dimensional side view of an NLX form factor I/O card 23 plugged into an AGP slot of an NLX form factor motherboard 24. The I/O card 23 is designed with cut-out 23a to enable it fit over the double-high connectors 25 mounted on the NLX motherboard.

What is claimed is:

1. A computer motherboard-mounted graphics card having at least one I/O connector, the card comprising:
    a DVI connector footprint capable of receiving a DVI connector and positioned on said graphics card adjacent to a vertical edge of the card;
    an HD-15 connector footprint capable of receiving an HD-15 connector and positioned an said graphics card behind said DVI connector footprint; and
    one of a right-angle, vertical edge, DVI connector and a right-angle, vertical edge HD-15 connector mounted with pins in a selected one of said DVI connector footprint and said HD-15 connector footprint.

2. The computer card as claimed in claim 1, wherein the HD-15 connector is selectively connected to said HD-15 connector footprint and has a correspondingly horizontally elongated body.

3. The computer card as claimed in claim 2, wherein the HD-15 connector comprises a first pair of card mounting members positioned vertically on each side of said pins and a third card mounting member positioned closer to said vertical edge, whereby the third card mounting member helps to stabilize the HD-15 connector on the computer card.

4. The computer card as claimed in claim 2, wherein said vertical edge has a lower cut-out for accommodating a double-high connector, said DVI connector footprint and said HD-15 connector footprint are positioned at an upper portion of the computer card, and said HD-15 connector footprint is located at a horizontal distance from said vertical edge greater than said lower cut-out, whereby a same HD-15 connector connectable to said HD-15 connector footprint could reach a footprint located on a lower portion of the computer card.

5. The computer card as claimed in claim 4, further comprising a third footprint positioned on a lower portion of the computer card near the lower cutout, the third footprint being vertically aligned with said HD-15 connector footprint.

6. The computer card as claimed in claim 5, further comprising a second right-angle, vertical edge, I/O connector mounted with pins in the third footprint, the second connector having a correspondingly horizontally elongated body.

7. The computer card as claimed in claim 6, wherein said HD-15 connector and said second I/O connector each comprise a first pair of card mounting members positioned vertically on each side of said pins and a third card mounting member positioned closer to said vertical edge on an upper side thereof, said third card mounting member of said second I/O connector being mounted to said card near an upper edge of said cut-out, whereby the third card mounting member helps to stabilize the I/O connectors on the computer card.

8. A computer motherboard-mounted card having at least one I/O connector, the card comprising:
- a vertical edge having a lower cut-out for accommodating a double-high connector;
- two footprints positioned one behind the other for accommodating two different output types and positioned at an upper portion of the computer card, and the a farther one of the two footprints located at a horizontal distance from said vertical edge greater than said lower cut-out; and
- one right-angle, vertical edge, I/O connector mounted with pins in a selected one of the two footprints, whereby a same I/O connector connectable to the farther footprint could roach a footprint located on a lower portion of the computer card.

9. The computer card as claimed in claim 8, further comprising a third footprint positioned on a lower portion of the computer card near the lower cut-out, the third footprint being vertically aligned with the farther footprint of said two footprints.

10. The computer card as claimed in claim 9, further comprising two sets of connector mounting member receiving holes provided in the computer card in a same position arrangement with respect to the farther one of the two footprints and to the third footprint, one of said holes being positioned with respect to the third footprint so as to be located near an upper edge of the lower cut-out close to a vertical edge of the computer card, whereby a connector-to-card mounting member received by the one of said holes can help to stabilize the I/O connector on the computer card when mounted in either the upper or lower portion of the card.

11. The computer card as claimed in claim 10, further comprising a second right-angle, vertical edge, I/O connector mounted with pins in the third footprint, the second I/O connector having a correspondingly horizontally elongated body.

12. The computer card as claimed in claim 11, wherein the one I/O connector is mounted with pins in a closer one of said two footprints.

13. The computer card as claimed in claim 11, wherein the second I/O connector is an HD-15 connector.

14. A method of manufacturing motherboard-mounted computer graphic cards having at least one I/O connector, the method comprising:
- providing at least a DVI connector footprint capable of receiving a DVI connector and positioned on each one of said computer cards adjacent to a vertical edge of the card, and an HD-15 connector footprint capable of receiving an HD-15 connector and positioned on each one of said computer cards further from said vertical edge than said DVI connector footprint; and
- providing a plurality of different right-angle, vertical edge, DVI and HD-15 connectors having mounting pins receivable by a selected one of said DVI connector footprint and said HD-15 connector footprint, said DVI and HD-15 connectors being adapted to reach the selected one of said footprints while providing a vertical edge I/O connector substantially at a common position with respect to said cards;
- selectively mounting one of said plurality of DVI and HD-15 connectors to one of said footprints to manufacture cards having a first I/O connector configuration; and
- selectively mounting another one of said plurality of DVI and HD-15 connectors to another one of said footprints to manufacture cards having a second I/O connector configuration.

15. The method as claimed in claim 14, wherein said DVI connector footprint and said HD-15 connector footprint are positioned one behind the other, one of said DVI and HD-15 connectors having a correspondingly horizontally elongated body.

16. A method of manufacturing a motherboard-mounted computer card having at least one I/O connector and a vertical edge having a lower cut-out for accommodating a double-high connector, the method comprising:
- providing at least two footprints positioned on the computer card for accommodating two different output types, the at least two footprints positioned at an upper portion of the computer card, and a farther one of the two footprints located at a horizontal distance from said vertical edge greater than said lower cut-out;
- providing a plurality of different right-angle, vertical edge, I/O connectors having mounting pins receivable by a selected one of the at least two footprints, said I/O connectors being adapted to reach the selected one of said footprints while providing a vertical edge I/O connector substantially at a common position; and
- selectively mounting one of said plurality of I/O connectors to one of said footprints.

17. The method as claimed in claim 16, further comprising:
- providing an additional lower footprint positioned on a lower portion of the computer card near a vertical edge of the lower cut-out, the lower footprint being vertically aligned with the farther footprint of said at least two upper footprints; and
- mounting one of said plurality of I/O connectors suitable for the farther one of the at least two upper footprints in the lower footprint.

18. The method as claimed in claim 17, further comprising:
- providing two sets of connector mounting member receiving holes in the computer card in a same position arrangement with respect to the farther one of the two upper footprints and to the lower footprint, one of said holes being positioned with respect to the lower footprint so as to be located near an upper edge of the lower cutout close to the vertical edge of the computer card;
- connecting connector-to-card mounting members of said one of said plurality of I/O connectors into said holes for the lower footprint, whereby the connector-to-card mounting member received by the one of said holes helps stabilize the I/O connector on the computer card mounted in lower portion of the card.

* * * * *

UNITED STATES PATENT AND TRADEMARK OFFICE
CERTIFICATE OF CORRECTION

PATENT NO. : 6,913,470 B1
APPLICATION NO. : 09/990876
DATED : July 5, 2005
INVENTOR(S) : Robert Lafleur It is certified that error appears in the above-identified patent and that said Letters Patent is hereby corrected as shown below:

Abstract, 5th line: should read: --connector is mounted--
Column 1, line 62: "single high" should read --single height--
Column 4, line 60: "footprint I" should read --footprint 1--
Column 6, line 22: "an" should read --on--
Column 6, line 40: "double-high" should read --double-height--
Column 7, line 4: "double-high" should read --double-height--
Column 7, line 14: "roach" should read --reach--
Column 8, line 18: "double-high" should read --double-height--
Column 8, line 59: should read: --in said lower--

Signed and Sealed this

Sixth Day of February, 2007

JON W. DUDAS
*Director of the United States Patent and Trademark Office*